United States Patent
Le

(10) Patent No.: US 6,353,904 B1
(45) Date of Patent: Mar. 5, 2002

(54) METHOD OF AUTOMATICALLY GENERATING NEW TEST PROGRAMS FOR MIXED-SIGNAL INTEGRATED CIRCUIT BASED ON REUSABLE TEST-BLOCK TEMPLATES ACCORDING TO USER-PROVIDED DRIVER FILE

(75) Inventor: Dai Minh Le, San Jose, CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/215,516

(22) Filed: Dec. 17, 1998

(51) Int. Cl.[7] .......................... G01R 31/28; G06F 11/00
(52) U.S. Cl. ................... 714/726; 714/734; 714/739; 714/741; 324/158.1; 371/27.4; 371/22.31
(58) Field of Search ................... 714/726, 734, 714/739, 741; 324/158.1; 371/27.4, 22.31

(56) References Cited

U.S. PATENT DOCUMENTS

| | | | |
|---|---|---|---|
| 5,481,471 A | * 1/1996 | Naglestad et al. | 714/734 X |
| 5,577,052 A | * 11/1996 | Morris | 714/733 |
| 5,604,432 A | * 2/1997 | Moore et al. | 324/158.1 |
| 5,617,431 A | * 4/1997 | Tupuri et al. | 714/738 |
| 5,815,513 A | * 9/1998 | Hiraide | 714/741 |
| 5,889,788 A | * 3/1999 | Pressly et al. | 714/726 |
| 6,182,258 B1 | * 1/2001 | Hollander | 714/739 |
| 6,202,183 B1 | * 3/2001 | Ginetti et al. | 714/726 |

FOREIGN PATENT DOCUMENTS

JP          405060833     * 3/1993

* cited by examiner

Primary Examiner—Thomas Lee
Assistant Examiner—Tammara Peyton
(74) Attorney, Agent, or Firm—Wagner, Murabito & Hao LLP

(57) ABSTRACT

A method of automatically generating a mixed-signal test program. The method according to one embodiment of the present invention is implemented in software in the form of two software processes. The first software process of the present embodiment includes a test-block extraction process which allows a user to extract re-usable test data from pre-existing test programs. The extracted re-usable test data is then stored in a template library in the form of a template. In one embodiment, the user only needs to provide the names of the interested cells and the corresponding pin designations to extract relevant test data from pre-exisiting test programs. The second software process of the present embodiment includes a test-block retargeting process which allows a user to use test data stored in the template library in a new mixed-signal test program. The names of the analog cells used in a new mixed-signal integrated design are provided to the test-block retargeting process. The test-block retargeting process retrieves the respective templates corresponding to the analog cells from the template library to generate the analog test-blocks for the interested analog cells. The analog test-blocks are automatically merged with digital test-blocks (obtained from logic simulation tools) to generate a new mixed-signal test program for the new mixed-signal integreated circuit design.

18 Claims, 5 Drawing Sheets

METHOD OF AUTOMATICALLY GENERATING NEW TEST PROGRAMS FOR MIXED-SIGNAL INTEGRATED CIRCUIT BASED ON REUSABLE TEST-BLOCK TEMPLATES ACCORDING TO USER-PROVIDED DRIVER FILE

FIELD OF THE INVENTION

The present invention relates to the field of testing integrated circuits. More specifically, the present invention relates to techniques for developing test programs for testing mixed-signal integrated circuits.

BACKGROUND OF THE INVENTION

In the design of electronic devices and systems, modern electronics engineers are increasingly reliant upon the use of computer-aided engineering (CAE) tools. Typically, using software design tools, an engineer can create a schematic diagram of the desired integrated circuit. Thereafter, the operations of the design are simulated on a computer using simulation software. If the simulation does not provide the desired results, the engineer may alter the schematic and re-run the simulation process. This process is repeated until the simulation demonstrates that the circuit is providing the desired results. Thereafter, circuit dies (chips) are fabricated from the design. With the assistance of these CAE tools, the production cycle of an integrated circuit design can be shortened.

Due to complications in the fabrication process and/or unforeseen design flaws, some fabricated chips may not meet the desired specifications. Therefore, chip testing must be performed before shipment to the customers. This testing process is typically carried out with the assistance of automated testing equipment (ATE). A number of different models of ATEs are commercially available from various manufacturers. Each model operates somewhat differently, and each has a specific format for test programs that will cause that particular model to execute different tests on a specific integrated circuit.

For digital integrated circuits designed with the aforementioned CAE tools, the process of preparing a test program is relatively straightforward. In many instances, test vectors used during the simulation phase of the design process can be used again by the ATEs. In order to conform to the specific requirements of specific ATEs, translator software programs have also been devised to convert the simulation test vectors into appropriate formats readable by the ATEs. For experienced quality-assurance engineers, test programs for a new digital integrated circuit can be prepared in several hours.

However, designing test programs for analog or mixed-signal integrated circuits is a much more involved process. Test engineers usually need to program from scratch for each new analog or mixed-signal integrated circuits. For example, in order to test the functionalities a digital-to-analog converter (DAC), it is often necessary to program the ATE to perform differential linearity error analysis, Fourier transforms, and signal-to-noise ratio analysis, etc. Programming an ATE to perform these complicated analyses is time-consuming and requires a high level of circuit testing skills. To fully test the functionalities of a complicated mixed-signal integrated circuit, a test program may contain more than 10,000 lines, and may take an experienced quality assurance engineer several months to complete. For novice engineers, the process can take more than six months.

In a highly competitive high-technology market, a prolonged testing process unnecessarily extends the product development cycle and increases development cost. Thus, what is needed is a method of assisting quality-assurance engineers in testing mixed-signal integrated circuits. What is further needed is a method of automatically generating test programs for testing analog and mixed-signal integrated circuits.

SUMMARY OF THE DISCLOSURE

In accordance with the present invention, a method of automatically generating a mixed-signal test program is provided. Particularly, the method according to one embodiment of the present invention is implemented in software in the form of two software processes. The first software process includes a test-block extraction process which allows a user to extract re-usable test data from pre-existing test programs. The extracted re-usable test data is then stored in a template library in the form of test-block templates. In one embodiment, the user only needs to provide the names of the interested cells and the corresponding pin designations to extract re-usable test data from pre-exisiting test programs.

According to the present embodiment, the second software process includes a test-block retargeting process which allows a user to use the re-usable test data stored in the template library for a new mixed-signal integrated circuit. In the present embodiment, the names of the analog cells used in a new mixed-signal integrated design are provided to the test-block retargeting process. The test-block retargeting process will then retrieve the test-block templates corresponding to the interested analog cells from the template library. The test-block retargeting process then generates the analog test-blocks for the interested analog cells. The analog test-blocks are then automatically merged with digital test-blocks, which may be obtained from logic simulation tools, to generate a new mixed-signal test program for the new mixed-signal integreated circuit design.

Embodiments of the present invention include the above and further include a method of automatically generating test programs comprising the steps of: providing to a computer system a source test program; extracting re-usable test data from the source test program; storing the re-usable test data in the form of an analog test-block template in a template library; retrieving the analog test-block template from the template library; mapping the re-usable test data to specific pins of a new mixed-signal integrated circuit design to generate an analog test-block for the new design; retrieving predetermined digital test vectors from a digital test vectors source; and combining the analog test-block and the predetermined digital test vectors to generate a test program for the new mixed-signal integrated circuit design.

BRIEF DESCRIPTIONS OF THE DRAWINGS

The accompanying drawings, which are incorporated in and form a part of this specification, illustrate embodiments of the present invention and, together with the description, serve to explain the principles of the invention.

DETAILED DESCRIPTION OF THE PREFERRED EMBODIMENTS

Reference will now be made in detail to the present embodiments of the invention, examples of which are illustrated in the accompanying drawings. While the invention will be described in conjunction with the present embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following description, for purposes of explanation, numerous specific details are set forth in order to provide a thorough understanding of the present invention. It will be apparent, however, to one skilled in the art, upon reading this disclosure, that the present invention may be practiced without these specific details. In other instances, well-known structures and devices are not described in detail in order to avoid obscuring aspects of the present invention.

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here and generally conceived to be a self-consistent sequence of steps of instructions leading to a desired result. The steps are those requiring physical manipulations of data representing physical quantities to achieve tangible and useful results. It has proven convenient at times, principally for reasons of common usage, to refer to these signals as bits, values, elements, symbols, characters, terms, numbers or the like.

Unless specifically stated otherwise as apparent from the following discussions, it is appreciated that throughout the present invention, discussions utilizing terms such as "receiving", "determining", "generating", "associating", "assigning" or the like, refer to the actions and processes of a computer system, or similar electronic computing device. The computer system or similar electronic device manipulates and transforms data represented as electronic quantities within the computer system's registers and memories into other data similarly represented as physical quantities within the computer system memories into other data similarly represented as physical quantities within the computer system memories or registers or other such information storage, transmission, or display devices.

COMPUTER SYSTEM ENVIRONMENT OF THE PRESENT INVENTION

Figure 1:
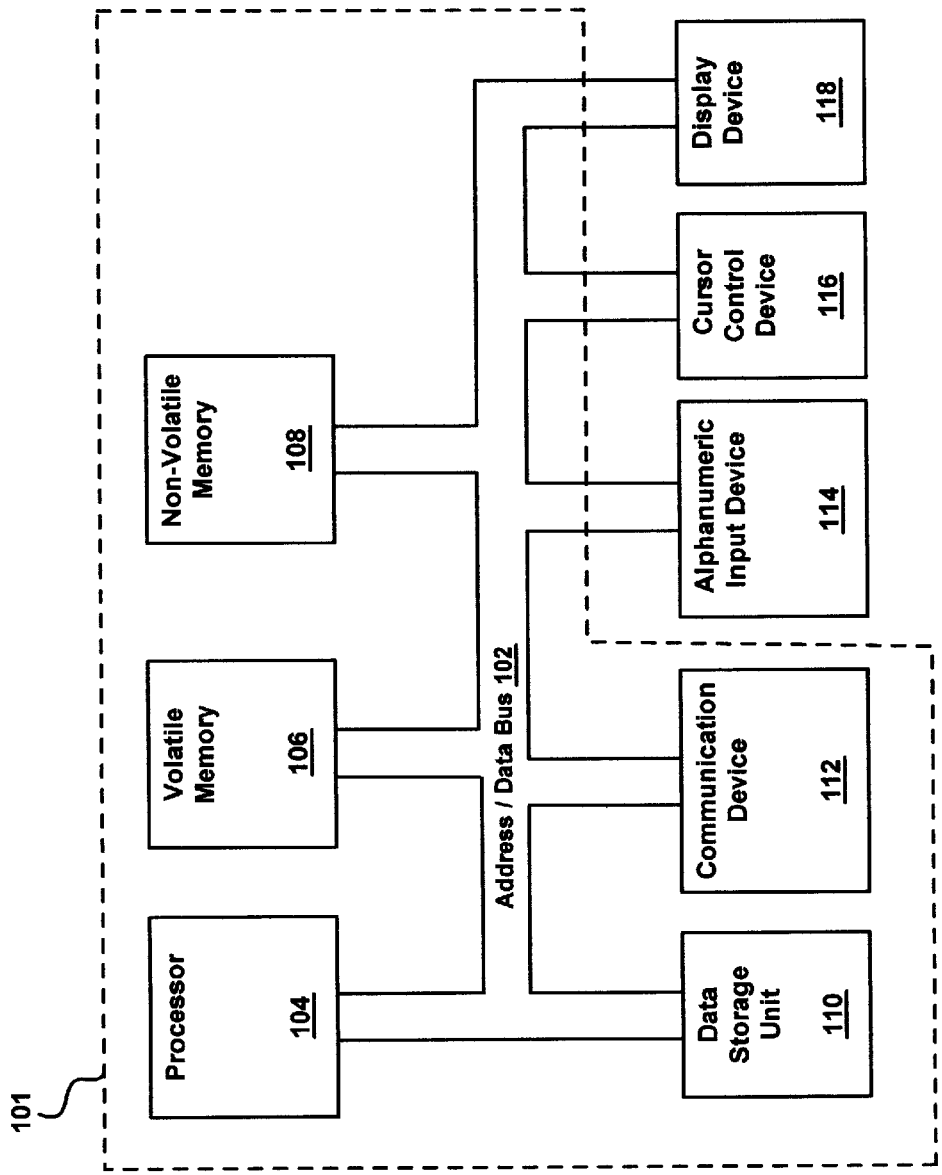
FIG. 1 is a block diagram illustrating an exemplary general purpose computer system in which different embodiments of the present invention can be implemented.

With reference to FIG. 1, portions of the present invention (e.g., processes 230 and 500) are comprised of computer-readable and computer executable instructions which reside, for example, in computer-usable media of a computer system. FIG. 1 illustrates an exemplary computer system 101 used as a part of an integrated-circuit testing system in accordance with one embodiment of the present invention. It is appreciated that system 101 of FIG. 1 is exemplary only and that the present invention can operate within a number of different computer systems including general purpose computer systems, embedded computer systems, and stand alone computer systems specially adapted for controlling automatic test equipment.

Computer system 101 includes an address/data bus 102 for communicating information, a central processor 104 coupled with bus 102 for processing information and instructions, a volatile memory 106 (e.g., random access memory RAM) coupled with the bus 102 for storing information and instructions for the central processor 104 and a non-volatile memory 108 (e.g., read only memory ROM) coupled with the bus 102 for storing static information and instructions for the processor 104. Computer system 101 also includes a data storage device 110 ("disk subsystem") such as a magnetic or optical disk and disk drive coupled with the bus 102 for storing information and instructions. Data storage device 110 can include one or more removable magnetic or optical storage media (e.g., diskettes, tapes) which are computer readable memories. Computer usable memory units of system 101 include volatile memory 106, non-volatile memory 108 and data storage device 110.

Computer system 101 can further include a communication device 112 (e.g., a modem, or a network interface card NIC) coupled to the bus 102 for interfacing with other computer systems. Also included in computer system 101 of FIG. 1 is an optional alphanumeric input device 114 including alphanumeric and function keys coupled to the bus 102 for communicating information and command selections to the central processor 104. Computer system 101 also includes an optional cursor control or directing device 116 coupled to the bus 102 for communicating user input information and command selections to the central processor 104. An optional display device 118 can also be coupled to the bus 102 for displaying information to the computer user. Display device 118 may be a liquid crystal device, other flat panel display, cathode ray tube, or other display device suitable for creating graphic images and alphanumeric characters recognizable to the user. Cursor control device 116 allows the computer user to dynamically signal the two dimensional movement of a visible symbol (cursor) on a display screen of display device 118. Many implementations of cursor control device 116 are known in the art including a trackball, mouse, touch pad, joystick or special keys on alphanumeric input device 114 capable of signaling movement of a given direction or manner of displacement. Alternatively, the computer system 101 may be adapted for receiving and interpreting voice commands. The computer system 101 may also include an adapter (not shown) coupled to bus 102 for controlling an automatic test equipment (ATE).

METHOD OF AUTOMATICALLY GENERATING MIXED-SIGNAL TEST PROGRAMS FOR TESTING MIXED-SIGNAL INTEGRATED CIRCUITS ACCORDING TO THE PRESENT INVENTION

The present invention provides for a method of automatically generating mixed-signal test programs for testing mixed-signal integrated circuits from pre-existing test programs. The method of the present invention may be implemented in a computer system (e.g., computer system 101) or embodied in a computer-usable medium in the form of software programs. In one particular embodiment, the method of the present invention is embodied in two software processes: a test-block extraction process, and a test-block retargeting process. It should be appreciated that the software processes of the present invention can be implemented using a number of software languages, for example, common computer programming language such as C, C++ or Java™.

Figure 2:
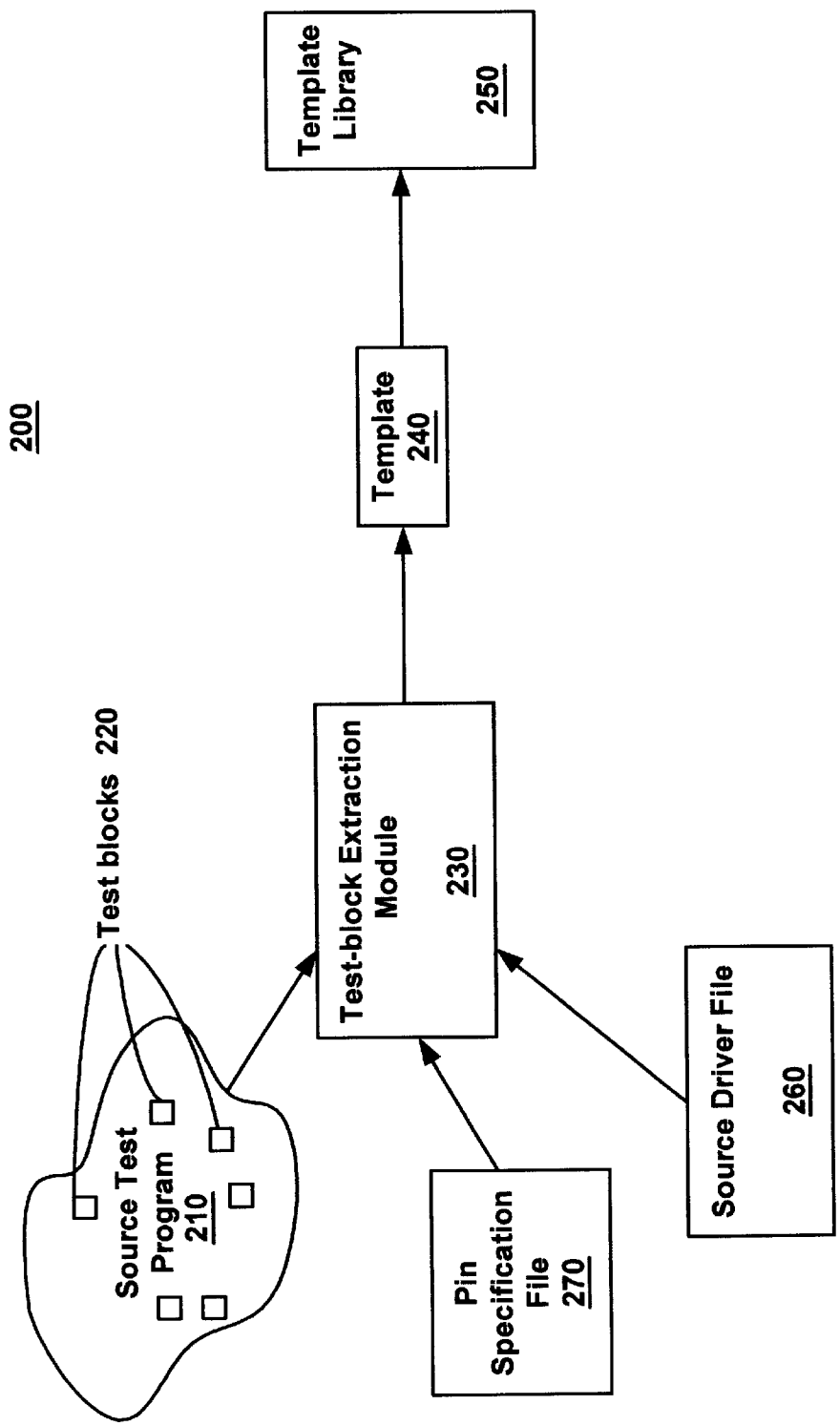
FIG. 2 is a block diagram illustrating the operations of the test-block extraction software process according to one embodiment of the present invention.

FIG. 2 illustrates a data flow and logical block diagram 200 of the test-block extraction software of the present invention. As illustrated in FIG. 2, a pre-existing test program 210, which is developed for a particular mixed-signal integrated circuit, is provided to a test-block extraction process 230. Pre-existing test program 210 includes a number of test-blocks 220 (e.g. blocks of test data) each for performing a particular functional or verification test on one or more analog cells. The pre-existing test program 210 is scanned and parsed by a test-block extraction process 230 to generate a cell-specific template 240. Particularly, test-blocks 220 corresponding to a particular analog cell are extracted by the test-block extraction process 230, and are inserted into the cell-specific template 240. The cell-specific template 240 may then be stored within a template library 250 together with other templates.

In order to generate the cell-specific template 240 correctly, a source driver file 260, and a pin specification file 270 are also used to direct the test-block extraction process 230 to extract the test-blocks and relevant data elements from the pre-existing test program. In the present embodiment, driver file 260 and pin specification file 270 are generated manually by the test engineer upon examining the source integrated circuit design. however, it should be appreciated that a computer tool may be developed to automatically generate the driver file 260 and the pin specification file 270.

Figure 3:
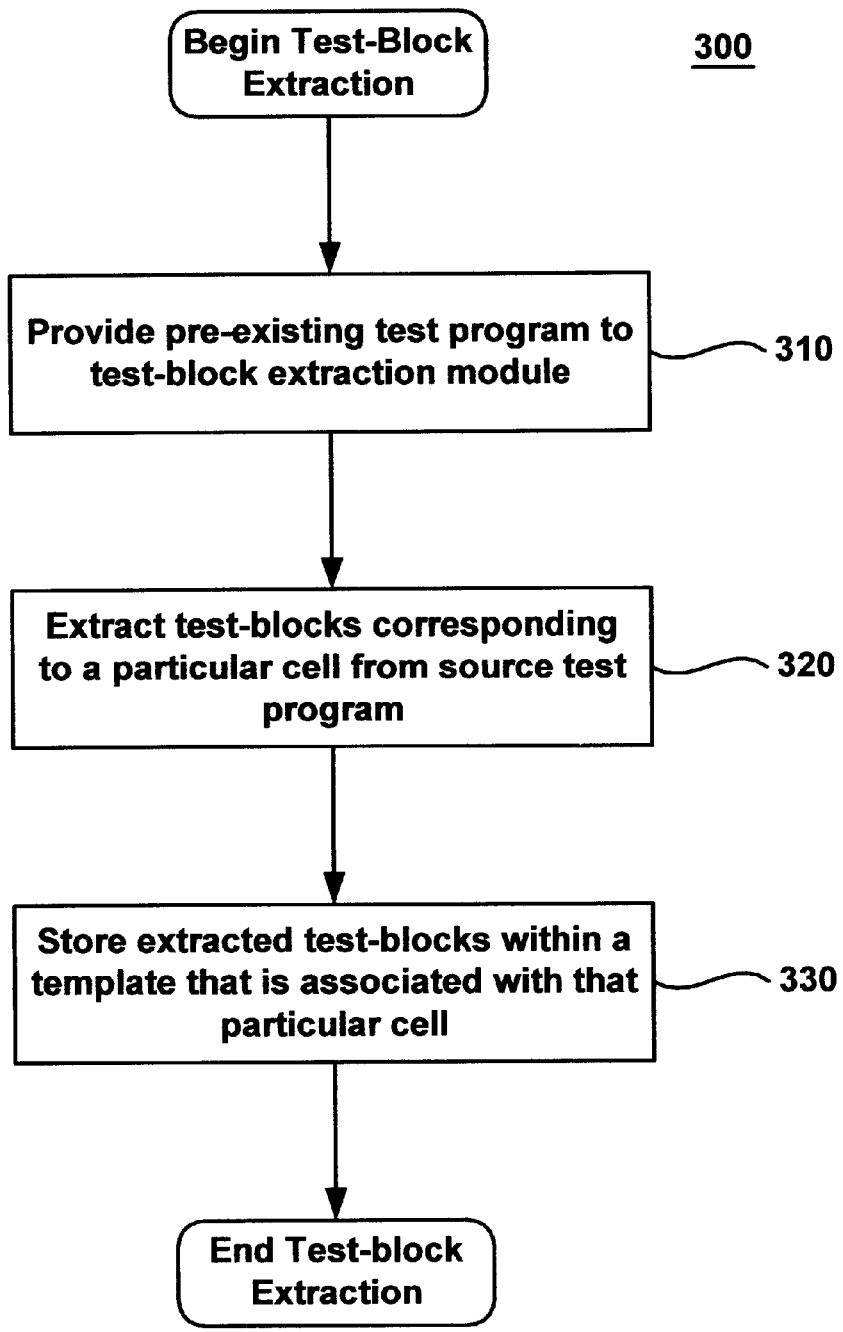
FIG. 3 is a flow diagram illustrating steps in a process of extracting test-blocks from pre-existing test programs using the test-block extraction software process in accordance with the present embodiment.

FIG. 3 is a flow diagram 300 illustrating the operations of the test-block extraction process 230 in accordance with the present embodiment. As illustrated, at step 310, a pre-existing test program (e.g. pre-existing test program 210 ) developed for a particular mixed-signal integrated circuit design is provided to the test-block extraction process. For simplicity, in the following discussions, the pre-existing test program will be referred to as the source test program, and the mixed-signal integrated circuit design for which the source test program is written will be referred to as the source design. The source test program is preferably developed by experienced test engineers for the present invention. It should be appreciated that the source test program do not have to be developed for the purpose of using the test-block extraction software of the present invention. Rather, any previously developed test programs can be used.

Typically, a source test program includes a plurality of test-blocks (e.g. blocks of test data) each for performing a different functional or verification test on one of the cells of the source design. For example, a source test program for a source design containing a digital-to-analog converter (DAC) cell may include a DLE test-block for performing a differential linearity error test, and a SNR test-block for performing a signal-to-noise ratio test on the DAC cell. The source test program may also include digital test data (or digital test blocks) for testing digital cells of the source design. An exemplary source test program is illustrated below in Table 1.

TABLE 1

Exemplary Source Test Program

```
//This is a sample list of mixed signal test block
//on the Schlumberger ITS9000MX tester:
mxsl_test sine_w4gsmadc {
   PINDEF_TABLE = normal,
   TIMING = w4gsmadc_tim,
   LEVELS = w4gsmadc_lvl,
   PATTERN_LIST = dyn_w4gsmadc_pat,
   OPEN_PINS = atap_dp_pins,
   TIMEOUT = 2000ms,
   HIDE_UNUSED_RESOURCE = FALSE,
   ANALOG_GENERATOR = { gen_drive_off_HF_w4gsmadc ,
      NULL, S2_sine_dd2a_w4gsmadc , S3_sine_w4gsmadc },
   ANALOG_MEASURE = { M0_sine_dd2_w4gsmadc , NULL,
NULL, NULL },
   GEN_POS = { (4 ,203 ) ,(7 ,316 ) , (9 ,411 ) , (7 ,501 ) },
   MEAS_POS = { (620 ,206 ) , (623 ,316 ) , (626 ,501 ) , (623
,501 ) },
   SPOT_POS = { (0 ,0 ) }
}; /* end of MXSL_TEST sine_w4gsmadc */
mxsl_test MXSL_AUX_ADC {
   PINDEF_TABLE = normal,
   TIMING = s_adc_tim,
   LEVELS = s_adc_lvl,
   FUNCTION = eir_aux_adc_close,
   PATTERN_LIST = s_adc_pat,
   OPEN_PINS = atap_dp_pins,
   TIMEOUT = 2000ms,
   HIDE_UNUSED_RESOURCE = FALSE,
   ANALOG_GENERATOR = { gen_drive_off , NULL,
gen_SIN_dd2a , gen_ramp_ha_ADC },
   ANALOG_MEASURE = { acq_aux_dd2a , NULL, NULL,
   NULL },
   GEN_POS = { (7 ,253 ) , (7 ,378 ) , (7 ,503 ) , (7 ,605 ) },
   MEAS_POS = { (623 ,253 ) , (623 ,378 ) , (623 ,503 ) , (623
,605 ) },
   SPOT_POS = { (7 ,128 ) }
}; /* end of MXSL_TEST MXSL_AUX_ADC */
mxsl_test MXSL_AUX_ADC_DUMMY {
   PINDEF_TABLE = normal,
   TIMING = s_adc_tim,
   LEVELS = s_adc_lvl,
   FUNCTION = eir_aux_adc_close,
   PATTERN_LIST = s_adc_pat,
   OPEN_PINS = atap_dp_pins,
   TIMEOUT = 2000ms,
   HIDE_UNUSED_RESOURCE = FALSE,
   ANALOG_GENERATOR = { gen_drive_off , NULL,
gen_SIN_dd2a , gen_ramp_ha_ADC },
   GEN_POS = { (7 ,253 ) , (7 ,378 ) , (7 ,503 ) , (7 ,605 ) },
   MEAS_POS = { (623 ,253 ) , (623 ,378 ) , (623 ,503 ) , (623
,605 ) },
   SPOT_POS = { (0 ,0 ) }
}; /* end of MXSL_TEST MXSL_AUX_ADC_DUMMY */
mxsl_test comp_w4daclpf {
   PINDEF_TABLE = normal,
   TIMING = dyn_w4daclpf_tim,
   LEVELS = stat_w4daclpf_lvl,
   PATTERN_LIST = dyn_w4daclpf_pat,
   OPEN_PINS = atap_dp_pins,
   TIMEOUT = 2000ms,
   HIDE_UNUSED_RESOURCE = TRUE,
   ANALOG_GENERATOR = { gen_drive_off_HF_w4daclpf ,
      NULL, S2_comp_dd2a_w4daclpf ,NULL },
   ANALOG_MEASURE = { M0_comp_w4daclpf , NULL, NULL,
   NULL },
   GEN_POS = { (7 ,253 ) , (7 ,316 ) , (8 ,441 ) , (7 ,501 ) },
   MEAS_POS = { (626 ,179 ) , (623 ,316 ) , (620 ,434 ) , (623
,501 ) },
   SPOT_POS = {( 7 ,106 ) }
}; /* end of MXSL_TEST comp_w4daclpf */
```

At step 320 of FIG. 3, the source test program is scanned and test-blocks corresponding to a specified cell are extracted from the source program by the test-block extraction software process of the present embodiment. According to the present embodiment, a user may specify the test-blocks to be extracted. For example, a user may choose to extract all the test-blocks associated with the cell W4DACLPF by specifying that cell in a driver file. An exemplary driver file for the test-block extraction process is illustrated below in Table 2.

TABLE 2

Exemplary Template Extraction Process Driver File

//driver file for cell: w4daclpf
//Syntax: composite NameOfComposite
begin test
composite W4DACLPF
end test As shown in the exemplary driver file of Table 2, a cell name "W4DACLPF" in the source test program is specified. The template extraction process, as directed by the template extraction driver file, will then intelligently copy from the source test program all test-blocks (or blocks of test codes) and all relevant test data pertaining to the cell W4DACLPF. For example, if a DLE test and a SNR test are associated with the cell W4DACLPF, then, DLE test-blocks and SNR test-blocks contained in the source test program and associated with the cell will be copied.

In the present embodiment, the user may also provide a pin specification file containing a list of pins of the source integrated circuit design that belong to the particular cell identified in the driver file. For example, the pin ANACLK_TG0 of the source integrated circuit design belongs to the cell W4DACLPF. In this example, the test-block extraction process may then extract all timing information and excitation patterns, etc., pertaining to the pin ANACLK_TG0 from the source test program. According to the present embodiment, the pin specification file may be manually created by the user. An exemplary pin specification file is given below in Table 3.

TABLE 3

Exemplary Pin Specification File

//W4DACLPF Test Case - Pins to be pulled
// for Test-block extraction Process
begin pinSpec
    DTR
    SIMPRES
    RTS
    CTS
    RXD
    DSR
    EIRQN
    AVS_EIR
    ANACLK_TG0
    ANACLK_TG1
    ANACLK_TG2
    ANACLK_TG3
    ANACLK_TG4
    ANACLK_TG5
    ANACLK_TG6
    ANACLK_TG7
    DD2A_SIN
    DD2A_DATAIN
    DD2A_1 DATAIN1
    DD2A_SOUT
    DD2A_DATAOUT
end pinSpec At step 330 of FIG. 3, the extracted test-blocks corresponding to that particular cell are stored as a cell-specific template within a template library for later retrieval. For instance, the test-blocks corresponding to an analog cell W4DACLPF will be saved to a template file W4DACLPF.tpl. The templates will then be used by the second software process of the present invention in a manner given below. Templates for other cells of the source integrated circuit design may also be created using the present test-block extraction process of the present invention.

Once a template is built for a particular analog cell, the template can be used if that particular analog cell is re-used in another mixed-signal circuit design. For simplicity, in the following discusion, the new mixed-signal design containing the re-used analog cell will be called the "target" design. The second software process of the present invention, the test-block retargeting process, provides the test engineers the capability of using the templates to automatically generate a test program for the target mixed-signal integrated circuit.

Figure 4:
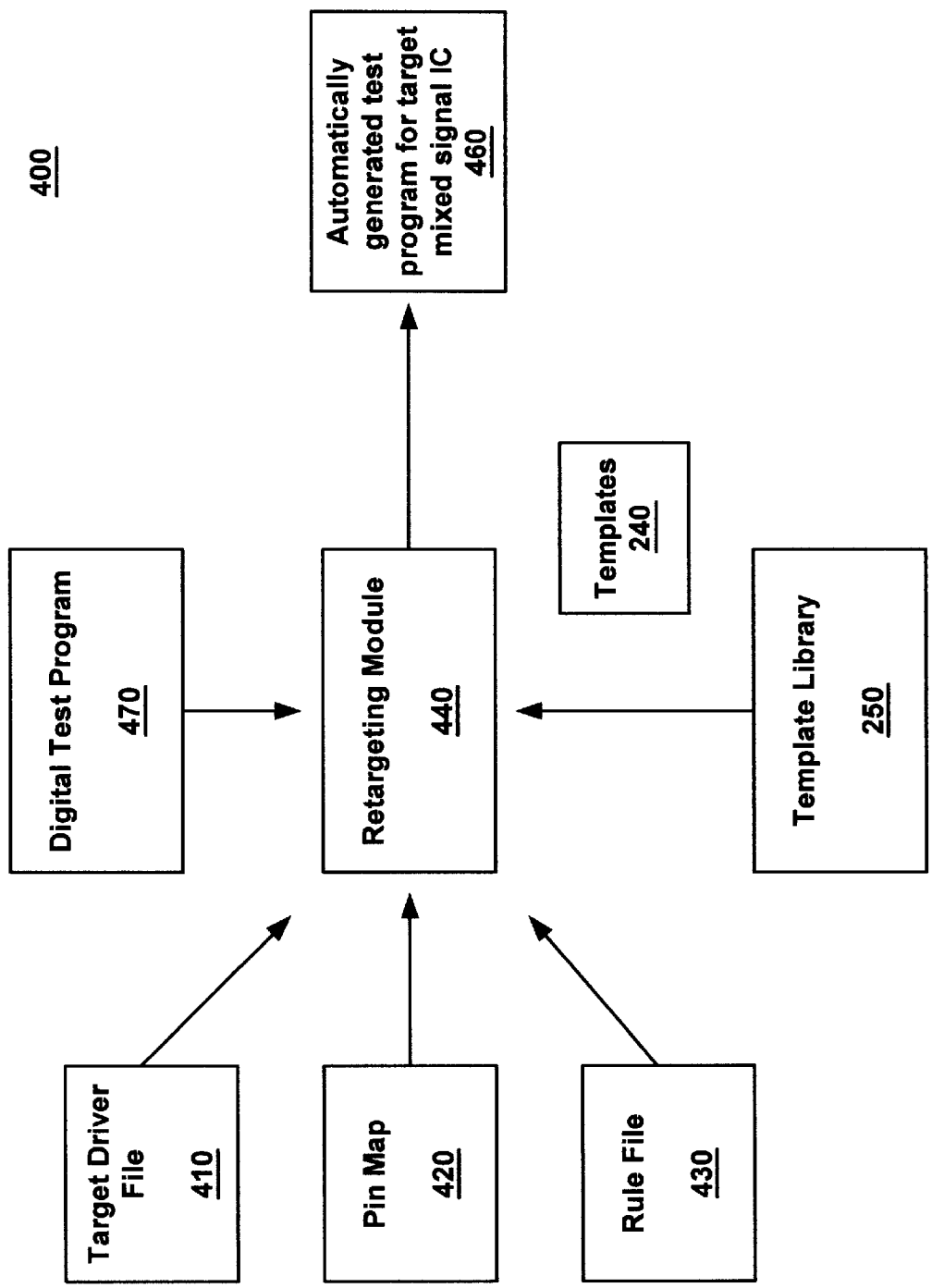
FIG. 4 is a block diagram illustrating the operations of the template retargeting software process according to one embodiment of the present invention.

FIG. 4 illustrates a conceptual block diagram 400 of the second software process, the test-block retargeting process, of the present invention. As illustrated, a target driver file 410, a pin-mapping file 420, and a rule file 430 are provided to test-block retargeting process 440 of the present invention. The test-block retargeting process 440 automatically loads appropriate cell-specific templates 240 from template library 250, and generates a new mixed-signal integrated circuit test program 460 based upon the information contained with the target driver file 410, the pin-mapping file 420, the rule file 430, and the cell-specific templates 240. A digital test program 470 containing test vectors for digital cells of the target design is also inserted by the retargeting process 440 into the target mixed-signal test program 460.

Particularly, in one embodiment, the target driver file 410 includes target-specific information such as the cell names of the cells to be tested in a new mixed-signal integrated circuit design (target design). The pin-mapping file 420 contains pin-designations of cells in the cell-specific templates 240 and corresponding pin-designations in the target design. The rule file 430 contains system-specific storage locations (e.g. path names and directory names) of each template.

Figure 5:
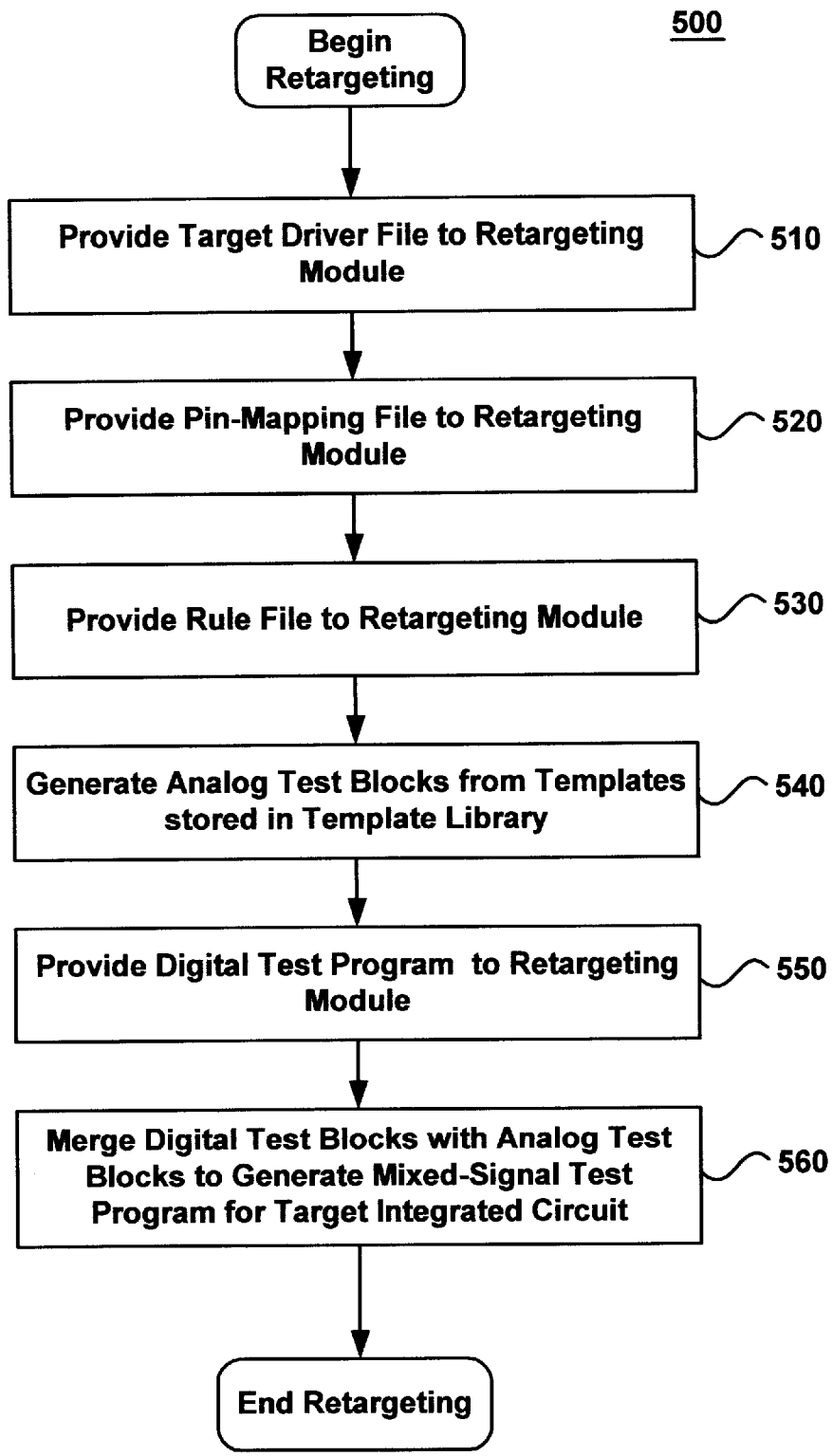
FIG. 5 is a flow diagram illustrating steps in a process of generating a new mixed-signal test program using a template according to one embodiment of the present invention.

FIG. 5 is a flow diagram 500 illustrating the operations of the test-block retargeting process in accordance with one embodiment of the present invention. As illustrates, at step 510, a target driver file is provided to the test-block retargeting process. According to the present embodiment, the target driver file contains a list of cell-specific templates that are used to reconstitute analog test-blocks in the target test program. In addition, the target driver file may also contain other information such as functional test sequences (test sequence) for programming all the pins of the ATE to the appropriate states during the analog tests. Functional test sequences generally include timing information, level information, and truth tables, and are well known in the art.

According to the present embodiment, the target driver file may be manually created by the test engineer, and is custom-tailored for the new mixed-signal integrated circuit design. For example, if the new mixed-signal integrated circuit design includes an analog cell W4DACLPF, the user would configure the target driver file to include the template W4DACLPF (corresponding to the cell W4DACLPF) such that the template W4DACLPF would be inserted in the new mixed-signal test program. An exemplary target driver file according to the present invention is given below in Table 4.

TABLE 4

Exemplary Target Driver File

```
//Mixed Signal Test Program Compiler Driver File
//Name: User-selected test program name.
//Cell:   Name of Cell within Template Library
begin MXFSB
//
//name        Cell        ftest sequence    level           AKey
//------------------------------------------------------------------
w4daclpf      w4daclpf    f1                nom_func_lvl    1
w4daclpf      w4daclpf    f1                min_func_lvl    1
end MXFSB
// target ftest
begin fseq
f1 NOM_FUNC, NOM_FUNC, NOM_FUNC, NOM_FUNC,
NOM_FUNC
f2 MIN_FB1_FUNC, NOM_FUNC, NOM_FUNC, NOM_FUNC,
NOM_FUNC
end fseq
```

With reference again to FIG. 5, at step 520, a pin-mapping file is provided to the test-block retargeting process of the present invention. According to the present embodiment, a pin-mapping file is used because each pin of the cell is typically given different names in different integrated circuit design. For example, a clock signal pin may be called ANACLK_0 in one design, and the same pin may be called CLK_15 in another design. Therefore, a pin-mapping file is used in the present invention for mapping the pin names of the template to the pin names of the new integrated circuit design. Test data associated with each pin in the template will be mapped over to the target test program by the test-block retargeting process of the present invention. An exemplary pin-mapping file is given below in Table 5.

TABLE 5

Exemplary Pin-Mapping File

```
//           target              template
begin map    w4daclpf            w4daclpf
             P_PFLASH_CSN        DTR
             P_EIRQN             SIMPRES
             P_LCD_CS            RTS
             P_FSYNC             TS
             P_FSYNC_AUX         RXD
             P_SFLASH_CSN        DSR
             P_EXT_WAITN         EIRQN
             PULSE_AVS           AVS_EIR
             ANACLK_TG0          ANACLK_TG0
             ANACLK_TG1          ANACLK_TG1
             ANACLK_TG2          ANACLK_TG2
             ANACLK_TG3          ANACLK_TG3
             ANACLK_TG4          ANACLK_TG4
             ANACLK_TG5          ANACLK_TG5
             ANACLK_TG6          ANACLK_TG6
             ANACLK_TG7          ANACLK_TG7
             DD2A_DATAIN_HA      DD2A_DATAIN
             DD2A_DATAIN_HA      DD2A_DATAIN1
             DD2A_SOUT           DD2A_SOUT
             DD2A_DATAOUT        DD2A_DATAOUT
endmap
```

The pin-mapping file is particularly useful for generating test programs or circuits that include more than one identical cells. In that case, the pins of each of the identical cells must be named differently.

As shown in FIG. 5, at step 530, a rule file is provided to the test-block retargeting process. According to the present embodiment, a rule file is used as a cross-reference between the names of the templates and the name of the files in which the templates are stored. An exemplary rule file according to the present embodiment is given below in Table 6.

TABLE 6

Exemplary Rule File for Test-Block Retargeting Process

```
//MTC Rule
begin tplDef
//Cell Name              Template Filename
//
HF_DAC01                 template1.tpl
HF_DAC02                 template2.tpl
HF_DAC03                 template3.tpl
HF_DAC04                 template4.tpl
HF_DAC05                 template5.tpl
HF_DAC06                 template6.tpl
HF_DAC07                 template7.tpl
HF_DAC08                 template8.tpl
vbafe1                   mainc9k.tpl
vbafe2                   mainc9k.tpl
w4daclpf                 mainc9k.tpl
end tplDef
//to be added to the target c9k
begin libFunc
lib_converter.c9k
lib_basics.c9k
lib_telecom.c9k
end libFunc
```

As shown in Table 6, in the exemplary rule file, each template is associated with one template file in which the template is contained. In this way, the test-block retargeting process would be able to locate the templates for the cells that are identified as part of the new mixed-signal integrated circuit design. In the present embodiment, the rule file may also include directory names or path names at which the template files may be found. Further, according to the present embodiment, the rule file be manually coded by the test engineer or automatically generated by computer tools according to the templates listed in the target driver file.

With reference still to FIG. 5, at step 540, analog test-blocks for the target analog cell are reconstituted from the templates according to the target-specific information provided in the target driver file and the pin-mapping file, and the system-specific information provided in the rule file. Although the illustrated target driver file indicates only a single analog cell W4DACLPF, it should be appreciated that test-blocks for multiple analog cells may be reconstituted from the templates.

At step 550, a digital test program to be inserted into the target test program is provided to the test-block retargeting process. The digital test program may contain a collection of digital test vectors that may be retrieved from logic simulation tools. The techniques for retrieving digital test vectors for a digital cell from logic simulation tools are well known in the art, and are therefore not described herein to avoid obscuring aspects of the invention.

At step 560, the retargeting process combines the digital test program with the analog test programs to generate the new mixed-signal test program. Thereafter, the new mixed-signal test program may be translated to the specific format suitable for a particular type or model of ATE for testing the new mixed-signal integrated circuit design.

The present invention, a method of automatically generating test programs for mixed-signal integrated circuits, has thus been described. The present invention helps to cut down the mixed signal test program generation cycle from weeks to day for experienced engineers, and eliminate tedious, repetitive editing tasks and the errors associated with hand-editing a test program. While the present invention has been described in particular embodiments, it should be appreciated that the present invention should not be construed as limited by such embodiments, but should be construed according to the below claims.

What is claimed is:

1. A computer implemented method of automatically generating test programs for testing a mixed-signal integrated circuit, said method comprising the steps of:

accessing a source test program that is developed for a source integrated circuit design that comprises a source analog cell;

extracting an analog test-block template corresponding to said source analog cell, said analog test-block template comprising re-usable test data for testing said source analog cell and wherein said analog test-block template is retrieved according to a user-provided driver file;

storing said analog test-block template in a template library; and generating a new test program for a new mixed-signal integrated circuit design based on said analog test-block template and based on predetermined digital test vectors, said step of generating performed when said source analog cell is used in said new design, said step of generating further comprising the steps of:
   retrieving said analog test-block template from said template library;
   mapping said re-usable test data to specific pins of said new mixed-signal integrated circuit design to generate an analog test-block for said new design;
   retrieving said predetermined digital test vectors from a digital test vectors source, wherein said predetermined digital test vectors are for testing digital cells of said new design; and
   combining said analog test-block and said predetermined digital test vectors to generate a test program for said new mixed-signal integrated circuit design.

2. The method as recited in claim 1 wherein said step of extracting further comprises the steps of:

analyzing said source test program to identify test data corresponding to said source analog cell; and removing data specific to said source integrated circuit design from said test data to produce said re-usable test data.

3. The method as recited in claim 1 wherein said re-usable test data is mapped to specific pins of said new mixed-signal integrated design according to a user-provided pin-mapping file.

4. A computer-implemented method of automatically generating test programs for testing a mixed-signal integrated circuit, said method comprising the steps of:

retrieving an analog test-block template from a template source, said analog test-block template including re-usable test data for testing an analog cell;

mapping said re-usable test data to specific pins of said mixed-signal integrated circuit to generate an analog test-block for said mixed-signal integrated circuit, said mixed-signal circuit having a digital cell and said analog cell;

retrieving predetermined digital test vectors from a digital test vectors source, wherein said predetermined digital test vectors are for testing said digital cell; and combining said analog test-block and said digital test vectors to generate a test program for said mixed-signal integrated circuit and wherein said analog test-block template is retrieved according to a user-provided driver file.

5. The method as recited in claim 4 wherein said analog test-block template is extracted from a pre-existing source test program for testing a source integrated circuit including said analog cell.

6. The method as recited in claim 4 wherein said template source comprises a database having a collection of analog test-block templates each for testing one of a plurality of analog cells.

7. The method as recited in claim 4 wherein said re-usable test data is mapped to said specific pins according to a user-provided pin-mapping file.

8. A computer-usable medium having computer-readable program code embodied therein for causing a computer system to perform a method of automatically generating test programs for testing mixed-signal integrated circuits, said method comprising the steps of:

said computer system accessing a source test program that is developed for a source integrated circuit design that comprises a source analog cell;

extracting an analog test-block template corresponding to said source analog cell, said analog test-block template including re-usable test data for testing said source analog cell; and automatically generating a new test program for a new mixed-signal integrated circuit design based on said analog test-block template and predetermined digital test vectors, said step of generating performed when said source analog cell is used in said new design, said step of generating further comprising the steps of:
   retrieving said analog test-block template from said template library;
   mapping said re-usable test data to specific pins of said new mixed-signal integrated circuit design to generate an analog test-block for said new design;
   retrieving said predetermined digital test vectors from a digital test vectors source, wherein said predetermined digital test vectors are for testing digital cells of said new design; and
   combining said analog test-block and said digital test vectors to generate a test program for said new mixed-signal integrated circuit design; and storing said analog test-block template in a template library and wherein said analog test-block template is retrieved according to a user-provided driver file.

9. The computer-usable medium as recited in claim 8 wherein said re-usable test data is mapped to specific pins of said new mixed-signal integrated design according to a user-provided pin-mapping file.

10. The computer-usable medium as recited in claim 8 wherein said step of extracting further comprises the steps of:

analyzing said source test program to identify test data corresponding to said source analog cell; and removing data specific to said source integrated circuit design from said test data to produce said re-usable test data.

11. A computer-usable medium having computer-readable program code embodied therein for causing a computer system to perform a method of automatically generating test programs for testing a mixed-signal integrated circuit, said method comprising the steps of:

retrieving an analog test-block template from a template source, said test-block template including re-usable test data for testing said analog cell;

mapping said re-usable test data to specific pins of said mixed-signal integrated circuit to generate an analog test-block for said mixed-signal integrated circuit, said mixed-signal integrated circuit comprising a digital cell and said analog cell;

retrieving predetermined digital test vectors from a digital test vectors source, wherein said predetermined digital test vectors are for testing said digital cell; and combining said analog test-block and said predetermined digital test vectors to generate a test program for said mixed-signal integrated circuit and wherein said re-usable test data is mapped to said specific pins according to a user-provided pin-mapping file.

12. The computer-usable medium as recited in claim 11 wherein said analog test-block template is extracted from a pre-existing source test program for testing a source integrated circuit that includes said analog cell.

13. The computer-usable medium as recited in claim 11 wherein said template source comprises a database having a collection of analog test-block templates each for testing one of a plurality of analog cells.

14. The computer-usable medium as recited in claim 11 wherein said analog test-block template is retrieved according to a user-provided driver file.

15. A computer-implemented method of automatically generating test programs for testing a mixed-signal integrated circuit, said method comprising the steps of:

retrieving an analog test-block template from a template source, said analog test-block template including re-usable test data for testing an analog cell;

mapping said re-usable test data to specific pins of said mixed-signal integrated circuit to generate an analog test-block for said mixed-signal integrated circuit, said mixed-signal circuit having a digital cell and said analog cell;

retrieving predetermined digital test vectors from a digital test vectors source, wherein said predetermined digital test vectors are for testing said digital cell; and combining said analog test-block and said digital test vectors to generate a test program for said mixed-signal integrated circuit and wherein said re-usable test data is mapped to said specific pins according to a user-provided pin-mapping file.

16. The method as recited in claim 15 wherein said analog test-block template is extracted from a pre-existing source test program for testing a source integrated circuit including said analog cell.

17. The method as recited in claim 15 wherein said template source comprises a database having a collection of analog test-block templates each for testing one of a plurality of analog cells.

18. The method as recited in claim 15 wherein said analog test-block template is retrieved according to a user-provided driver file.

* * * * *